United States Patent
Ni et al.

(10) Patent No.: US 12,173,401 B2
(45) Date of Patent: Dec. 24, 2024

(54) METHOD FOR MANUFACTURING SEMICONDUCTOR DEVICE, AND FILM-FORMING DEVICE

(71) Applicant: TOKYO ELECTRON LIMITED, Tokyo (JP)

(72) Inventors: Zeyuan Ni, Yamanashi (JP); Taiki Kato, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 364 days.

(21) Appl. No.: 17/761,943

(22) PCT Filed: Sep. 14, 2020

(86) PCT No.: PCT/JP2020/034682
§ 371 (c)(1),
(2) Date: Mar. 18, 2022

(87) PCT Pub. No.: WO2021/060047
PCT Pub. Date: Apr. 1, 2021

(65) Prior Publication Data
US 2022/0372618 A1 Nov. 24, 2022

(30) Foreign Application Priority Data

Sep. 25, 2019 (JP) ................................ 2019-174644

(51) Int. Cl.
*H01L 21/02* (2006.01)
*C23C 16/44* (2006.01)
*C23C 16/455* (2006.01)

(52) U.S. Cl.
CPC ........ *C23C 16/455* (2013.01); *C23C 16/4408* (2013.01); *H01L 21/02186* (2013.01); *H01L 21/02205* (2013.01); *H01L 21/0228* (2013.01)

(58) Field of Classification Search
CPC .  C23C 16/455; C23C 16/4408; C23C 16/045; C23C 16/45534; C23C 16/45565;
(Continued)

(56) References Cited

U.S. PATENT DOCUMENTS 10,151,029 B2 * 12/2018 Fukiage ............ H01L 21/02186
10,483,100 B2 * 11/2019 Ishizaka ............ H01L 21/67213
(Continued)

FOREIGN PATENT DOCUMENTS

| JP | 2017-69407 A | 4/2017 |
| JP | 2018-66050 A | 4/2018 |
| KR | 10-2016-0031413 A | 3/2016 |

OTHER PUBLICATIONS

PCT International Search Report and Written Opinion, PCT Application No. PCT/JP2020/034682, Oct. 27, 2020, 9 pages (with English translation of PCT International Search Report).

*Primary Examiner* — David A Zarneke
(74) *Attorney, Agent, or Firm* — Fenwick & West LLP

(57) ABSTRACT

A method for manufacturing a semiconductor device including a TiN film. The method comprises: supplying $TiCl_4$ gas to a substrate; purging the $TiCl_4$ gas; supplying $NH_3$ gas to the substrate; purging the $NH_3$ gas; and supplying an inhibitor that inhibits adsorption of $TiCl_4$ or $NH_3$ to the substrate. A plurality of cycles each including the supplying the $TiCl_4$ gas, the purging the $TiCl_4$ gas, the supplying the $NH_3$ gas, and the purging the $NH_3$ gas are performed, at least a part of the plurality of cycles includes the supplying the inhibitor, and after the supplying the inhibitor is performed, the supplying the $TiCl_4$ gas or the supplying the $NH_3$ gas is performed without purging the inhibitor, or, after purging the inhibitor for a shorter time than the purging the $TiCl_4$ gas or the purging the $NH_3$ gas, the supplying the $TiCl_4$ gas or the supplying the $NH_3$ gas is performed.

9 Claims, 20 Drawing Sheets

(58) Field of Classification Search
CPC .................. C23C 16/34; H01L 21/0228; H01L 21/76843; H01L 21/02186; H01L 21/02205; H01L 21/28562; H01L 21/28; H01L 21/32053; H01L 21/28556; H01L 21/28568
See application file for complete search history.

(56) References Cited

U.S. PATENT DOCUMENTS 11,152,207 B2 * 10/2021 Tapily ............... H01L 21/67207
2016/0079070 A1 3/2016 Ogawa et al.

* cited by examiner

METHOD FOR MANUFACTURING SEMICONDUCTOR DEVICE, AND FILM-FORMING DEVICE

TECHNICAL FIELD

The present disclosure relates to a method for manufacturing a semiconductor device and a film-forming device.

BACKGROUND

A technique for forming a TiN film on a substrate using an atomic layer deposition (ALD) method, in which $TiCl_4$ gas and $NH_3$ gas are alternately supplied onto a substrate, is known (e.g., see Patent Document 1).

PRIOR ART DOCUMENTS

Patent Documents

Patent Document 1: Japanese Laid-open Patent Publication No. 2018-66050

SUMMARY

Problems to Be Resolved by the Invention

The present disclosure provides a technique capable of adjusting a film formation amount of a TiN film.

Means for Solving the Problem

One aspect of the present disclosure provides a method for manufacturing a semiconductor device, which is a method for manufacturing a semiconductor device including a TiN film, the method comprising supplying $TiCl_4$ gas to a substrate, purging the $TiCl_4$ gas, supplying $NH_3$ gas to the substrate, purging the $NH_3$ gas, and supplying an inhibitor that inhibits adsorption of $TiCl_4$ or $NH_3$ to the substrate, wherein a plurality of cycles each including the supplying the $TiCl_4$ gas, the purging the $TiCl_4$ gas, the supplying the $NH_3$ gas, and the purging the $NH_3$ gas are performed, at least a part of the plurality of cycles includes the supplying the inhibitor, and after the supplying the inhibitor is performed, the supplying the $TiCl_4$ gas or the supplying the $NH_3$ gas is performed without purging the inhibitor, or, after purging the inhibitor for a shorter time than the purging the $TiCl_4$ gas or the purging the $NH_3$ gas, the supplying the $TiCl_4$ gas or the supplying the $NH_3$ gas is performed.

Effect of the Invention

According to the present disclosure, a film formation amount of a TiN film can be adjusted.

DETAILED DESCRIPTION

Figure 1:
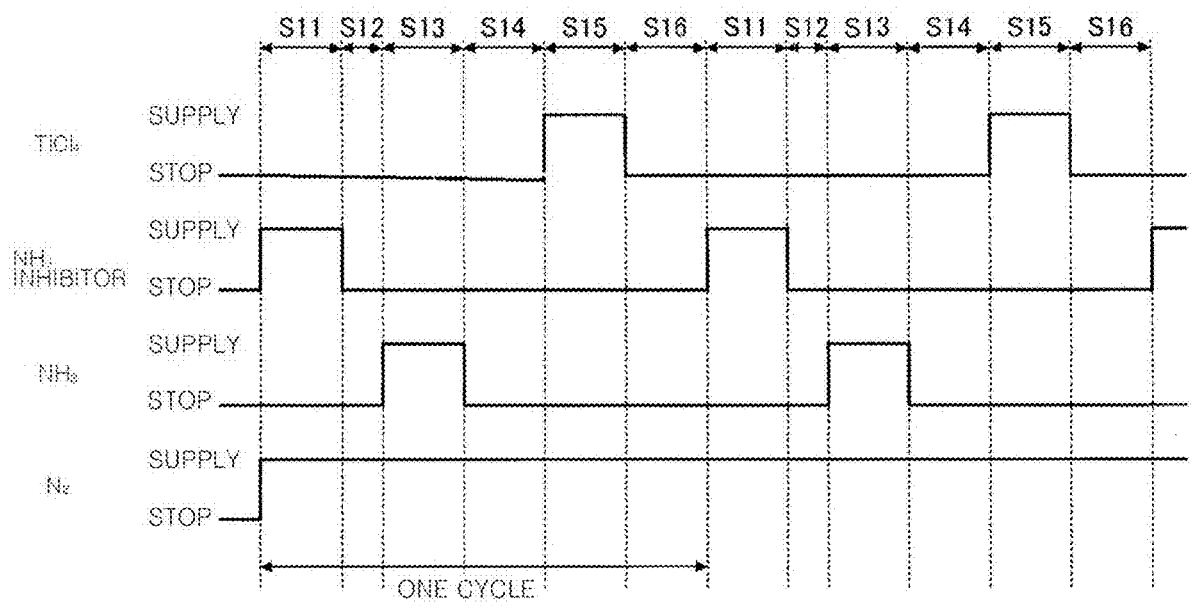
FIG. 1 is a diagram illustrating an example of a gas supply sequence of a method of forming a TiN film according to an embodiment.

Hereinafter, non-limiting exemplary embodiments of the present disclosure will be described with reference to the accompanying drawings. The same or corresponding reference numerals are assigned to the same or corresponding members or parts among all of the accompanying drawings, and descriptions thereof will not be repeated.

[Method of Forming TiN Film]

A method of forming a titanium nitride (TiN) film according to an embodiment is, for example, a method of forming a TiN film on a substrate having a concave portion such as a trench, a hole, or the like on a surface using an atomic layer deposition (ALD) process, and the method is performed in a state in which the substrate having the concave portion is accommodated in a processing container. As the substrate, any substrate to which an ALD process can be applied can be widely used. The substrate to which the ALD process can be applied is, for example, a semiconductor substrate made of silicon and the like. Examples of the substrate may include, for example, a semiconductor substrate used for manufacturing a semiconductor device (e.g., a dynamic random access memory (DRAM)) having a capacitor electrode.

(Example Using $NH_3$ Inhibitor)

FIG. 1 is a diagram illustrating an example of a gas supply sequence of a method of forming a TiN film according to an embodiment. In the method of forming the TiN film illustrated in FIG. 1, a plurality of cycles each including processes S11 to S16 are performed. Process S11 is a process of supplying an $NH_3$ inhibitor that inhibits adsorption of $NH_3$. Process S12 is a process of adjusting an adsorption amount of the $NH_3$ inhibitor. Process S13 is a process of supplying the $NH_3$ to a substrate. Process S14 is a process of purging the $NH_3$. Process S15 is a process of supplying $TiCl_4$ to the substrate. Process S16 is a process of purging the $TiCl_4$.

Figure 2A:
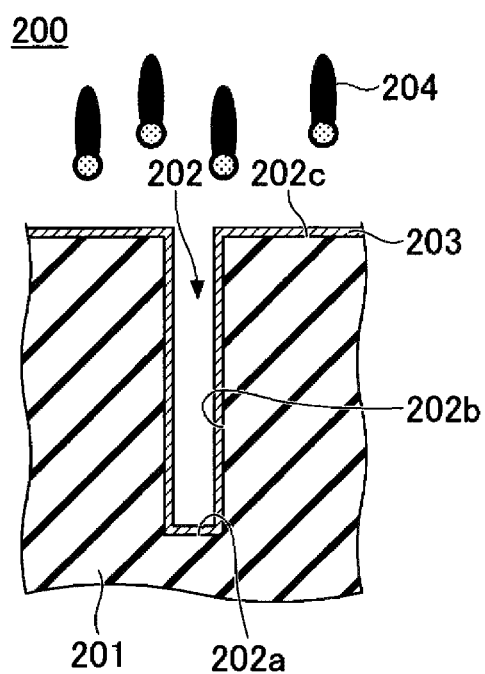
FIG. 2A is a process cross-sectional view illustrating an example of a method of forming a TiN film according to an embodiment.

FIGS. 2A to 2G are process cross-sectional views illustrating an example of a method of forming a TiN film according to an embodiment. FIGS. 2A to 2G illustrate a state in which a $TiCl_x$ layer (x is 1 to 4) is formed on an outermost surface of a concave portion after the plurality of cycles each including processes S11 to S16 are performed from the imitation of the method of forming the TiN film. As illustrated in FIG. 2A, a target substrate 200 on which a TiN film is formed includes an insulating film 201 in which a concave portion 202 is formed. The insulating film 201 may be an $SiO_2$ film or an $Al_2O_3$ film.

Process S11 is performed after a process of supplying $TiCl_4$ and before a process of supplying $NH_3$. In process S11, as illustrated in FIG. 2A, an $NH_3$ inhibitor 204 that inhibits adsorption of $NH_3$ 205 is supplied to the substrate 200.

The $NH_3$ inhibitor preferably contains an organic compound having at least one of a C=O bond, an S=O bond, a CN ring, and a CO ring. The organic compound having at least one of the C=O bond, the S=O bond, the CN ring, and the CO ring has high adsorption energy on a surface of a $TiCl_x$ layer, and thus the organic compound is likely to be adsorbed on the surface of the $TiCl_x$ layer. Further, since an adsorption reaction on the surface of the $TiCl_x$ layer is mass conservative, a reverse reaction is likely to occur, and removal of the organic compound is easy. For example, it is possible to remove the organic compound in process S16 of purging the $TiCl_4$. For this reason, the organic compound does not need to be removed using an etching process or the like and is easy to introduce. Further, the term "mass conservative" means that the $NH_3$ inhibitor is adsorbed on the surface of the $TiCl_x$ layer without causing mass loss.

Further, the $NH_3$ inhibitor is preferably acetone ($C_3H_6O$), dimethyl sulfoxide (DMSO) ($C_2H_6SO$), tetrahydrofuran (THF) ($C_4H_8O$), pyridine ($C_5H_5N$), or a derivative thereof. These organic compounds have low raw material costs and are relatively safe. Further, these organic compounds have high vapor pressures and are easily gasified. Further, these organic compounds can be easily removed by purging. Further, adsorption energies of these organic compounds can be easily adjusted using steric hindrance due to introduction of side chains. Further, examples of a derivative of acetone may include ethylmethyl ketone ($C_4H_8O$) and diethyl ketone ($C_5H_{10}O$). Further, examples of a derivative of THF may include dimethyltetrahydrofuran ($C_6H_{12}O$).

The supply of the $NH_3$ inhibitor 204 may be performed in a dilution gas environment. For example, the $NH_3$ inhibitor 204 may be supplied after an inside of a processing container is replaced with a dilution gas. Further, for example, the dilution gas may be supplied into the processing container together with the $NH_3$ inhibitor 204. In this case, the $NH_3$ inhibitor 204 may be supplied while supplying the dilution gas into the processing container, or the dilution gas and the $NH_3$ inhibitor 204 may be mixed and then the $NH_3$ inhibitor 204 (mixed gas) diluted with the dilution gas may be supplied into the processing container. Examples of the dilution gas may include an inert gas such as nitrogen ($N_2$) gas, a rare gas, or the like, carbon dioxide ($CO_2$) gas, and carbon monoxide (CO) gas. The dilution gas preferably contains at least one type of gas selected from the group consisting of helium (He) gas, neon (Ne) gas, argon (Ar) gas, krypton (Kr) gas, xenon (Xe) gas, $N_2$ gas, $CO_2$ gas, and CO gas.

Figure 2B:
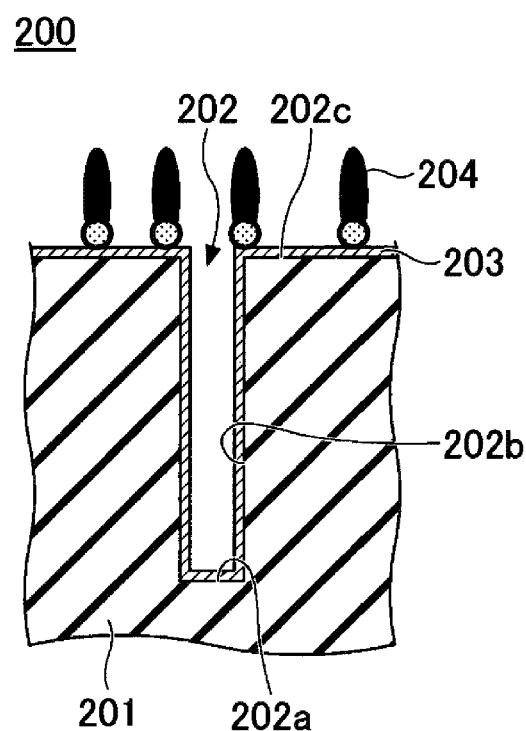
FIG. 2B is a process cross-sectional view illustrating the example of the method of forming the TiN film according to the embodiment.

In process S11, since the $NH_3$ inhibitor 204 is adsorbed on a surface of a $TiCl_x$ layer 203 formed in the concave portion 202, it is preferable that the $NH_3$ inhibitor 204 is easily adsorbed on the $TiCl_x$ layer 203. The organic compound having at least one of a C=O bond, an S=O bond, a CN ring, and a CO ring has high adsorption energy on the surface of the $TiCl_x$ layer 203. For this reason, as illustrated in FIG. 2B, the organic compound is more likely to be adsorbed on an upper surface 202c of the concave portion 202 than on a bottom surface 202a and an inner wall 202b thereof.

The likelihood of the adsorption of the $NH_3$ inhibitor 204 on the $TiCl_x$ layer 203 can be predicted, for example, by evaluating an adsorption energy (hereinafter referred to as a "first adsorption energy") of the $NH_3$ inhibitor 204 on the surface (surface site) of the $TiCl_x$ layer 203. Further, the "first adsorption energy" is given as a value obtained by subtracting energy before the adsorption from energy when the $NH_3$ inhibitor 204 is adsorbed on the surface site, and a negative value indicates that the adsorption state is stable. Further, the larger the first adsorption energy (negative value), the easier it is for the $NH_3$ inhibitor 204 to be adsorbed on the surface site, and the stronger an adsorption force is. The first adsorption energy is obtained by, for example, a density functional theory (PBE/DNP) using the DMol3 module of the software Materials Studio.

In process S12, a purge gas is supplied into the processing container. Thereby, an amount of the $NH_3$ inhibitor 204 adsorbed on the $TiCl_x$ layer 203 is adjusted. Specifically, by supplying the purge gas into the processing container, a part of the $NH_3$ inhibitor 204 adsorbed on the surface of the $TiCl_x$ layer 203 is removed together with the purge gas, and thus the amount of the $NH_3$ inhibitor 204 adsorbed on the $TiCl_x$ layer 203 is adjusted. In order to prevent the $NH_3$ inhibitor 204 adsorbed on the surface of the $TiCl_x$ layer 203 from being completely removed, a time of process S12 of adjusting the adsorption amount of the $NH_3$ inhibitor 204 is preferably shorter than a time of process S14 of purging the $NH_3$. Further, when it is not necessary to adjust the amount of the $NH_3$ inhibitor 204 adsorbed on the $TiCl_x$ layer 203, process S12 may be omitted. Examples of the purge gas may include an inert gas such as $N_2$ gas, a rare gas, or the like, $CO_2$ gas, and CO gas. Conditions for supplying the purge gas in process S12 are not particularly limited.

Further, process S12 may be performed by, for example, vacuum suctioning the inside of the processing container without supplying the purge gas into the processing container. Further, process S12 may be performed by supplying the purge gas into the processing container and then vacuum suctioning the inside of the processing container without supplying the purge gas into the processing container. Further, process S12 may be performed by a cycle purge in which the supply of the purge gas and the vacuum suction are repeated.

Figure 2C:
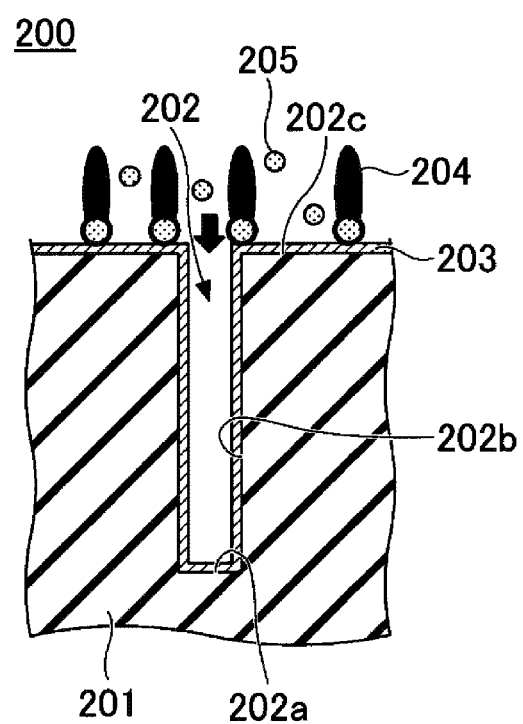
FIG. 2C is a process cross-sectional view illustrating the example of the method of forming the TiN film according to the embodiment.
Figure 2D:
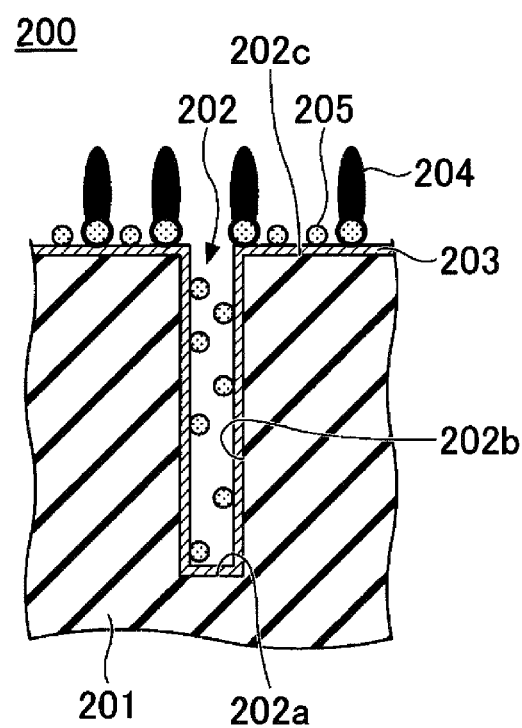
FIG. 2D is a process cross-sectional view illustrating the example of the method of forming the TiN film according to the embodiment.

In process S13, the $NH_3$ 205 is supplied to the concave portion 202, as illustrated in FIG. 2C. In this case, since a greater amount of the $NH_3$ inhibitor 204 is adsorbed on the upper surface 202c of the concave portion 202 than on the bottom surface 202a and the inner wall 202b thereof, a part of the adsorption of the $NH_3$ 205 on the upper surface 202c of the concave portion 202 is inhibited, as illustrated in FIG. 2D. For this reason, the $NH_3$ 205 is adsorbed on the bottom surface 202a, the inner wall 202b, and the upper surface 202c of the concave portion 202 substantially uniformly.

Figure 2E:
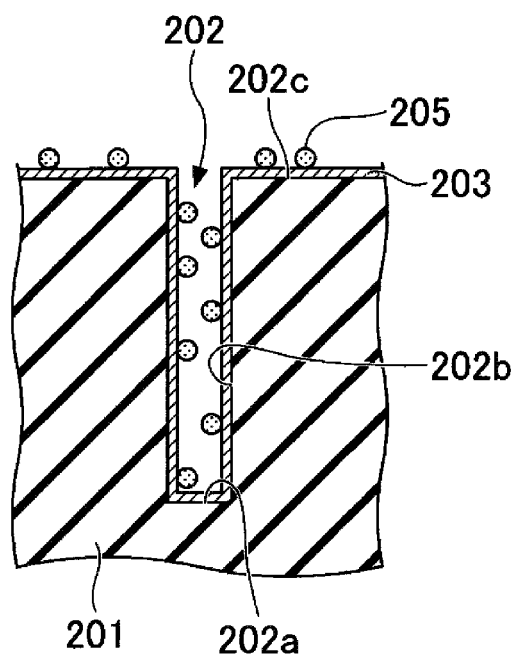
FIG. 2E is a process cross-sectional view illustrating the example of the method of forming the TiN film according to the embodiment.

In process S14, the purge gas is supplied into the processing container. Thereby, as illustrated in FIG. 2E, the $NH_3$ inhibitor 204 adsorbed on the surface of the $TiCl_x$ layer 203 and the $NH_3$ 205 remaining in the processing container are exhausted and removed from the inside of the processing container. Details of the purge gas and conditions for supplying the purge gas in process S14 may be the same as those in process S12 described above.

Figure 2F:
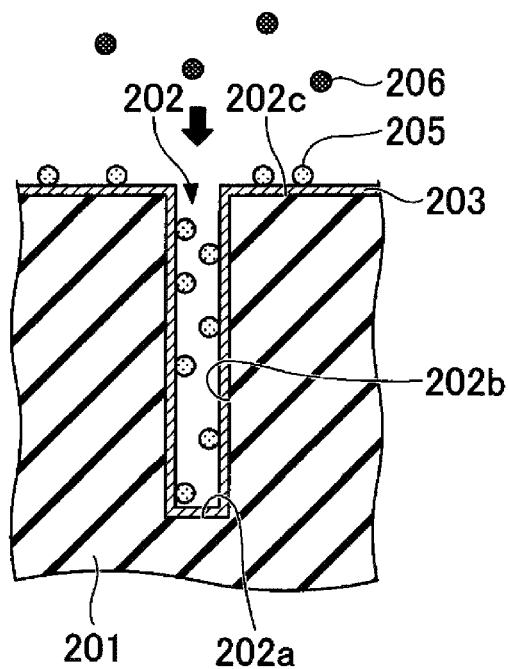
FIG. 2F is a process cross-sectional view illustrating the example of the method of forming the TiN film according to the embodiment.
Figure 2G:
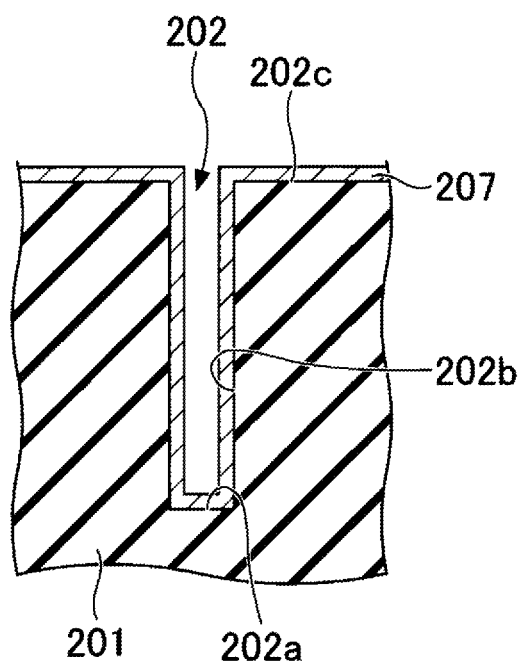
FIG. 2G is a process cross-sectional view illustrating the example of the method of forming the TiN film according to the embodiment.

In process S15, $TiCl_4$ 206 is supplied to the concave portion 202, as illustrated in FIG. 2F. Thereby, as illustrated in FIG. 2G, the $NH_3$ 205 adsorbed on the concave portion 202 and the $TiCl_4$ 206 supplied to the concave portion 202 react with each other, and thus a TiN layer 207 is formed.

In process S16, the purge gas is supplied into the processing container. Thereby, the $TiCl_4$ 206 remaining in the processing container is removed from the inside of the processing container. Specifically, by supplying the purge gas into the processing container, the $TiCl_4$ 206 in the processing container is exhausted together with the purge gas and removed from the inside of the processing container. Details of the purge gas and conditions for supplying the purge gas in process S16 may be the same as those in process S12 described above.

As described above, in the method of forming the TiN film according to the embodiment, before the $NH_3$ 205 is supplied to the concave portion 202, a greater amount of the $NH_3$ inhibitor 204 is adsorbed on an upper portion of the concave portion 202 than on a lower portion thereof. In the case in which a greater amount of the $NH_3$ inhibitor 204 is adsorbed on the upper portion of the concave portion 202 than on the lower portion thereof, when the $NH_3$ 205 is supplied to the concave portion 202, the adsorption of the $NH_3$ 205 onto the upper surface 202c of the concave portion 202 is inhibited. For this reason, the $NH_3$ 205 is adsorbed on the bottom surface 202a, the inner wall 202b, and the upper surface 202c of the concave portion 202 substantially uniformly. As a result, a thickness of the TiN layer 207 formed by reacting the $NH_3$ 205 and the $TiCl_4$ 206 becomes uniform. That is, a conformal TiN film can be formed in the concave portion 202.

Further, the method of forming the TiN film according to the embodiment can be suitably used in, for example, an application for forming a capacitor electrode. In particular, in a semiconductor device having a memory cell such as a DRAM or the like, due to complexity of the trench structure and an increase in aspect ratio of a trench, the step coverage of the TiN film has become an important issue. Therefore, according to the method of forming the TiN film according to the embodiment, ideal conformal film formation with high step coverage and a low loading effect is possible.

Further, although the case in which all of the plurality of cycles include process S11 of supplying the $NH_3$ inhibitor 204 is illustrated in the example of FIG. 1, the present disclosure is not limited thereto. For example, at least a part of the plurality of cycles may include process S11 of supplying the $NH_3$ inhibitor 204. In other words, in at least a part of the plurality of cycles, process S11 of supplying the $NH_3$ inhibitor 204 may be omitted. However, from the viewpoint of obtaining a more conformal TiN film, it is preferable to perform process S11 of supplying the $NH_3$ inhibitor 204 in all the cycles.

Further, although the case in which the $N_2$ gas is supplied in all processes S11 to S16 is illustrated in the example of FIG. 1, the present disclosure is not limited thereto. For example, the $N_2$ gas may be supplied at least in purging processes S12, S14, and S16, and the $N_2$ gas may not be supplied in processes S11, S13, and S15.

(Example Using $TiCl_4$ Inhibitor)

Figure 3:
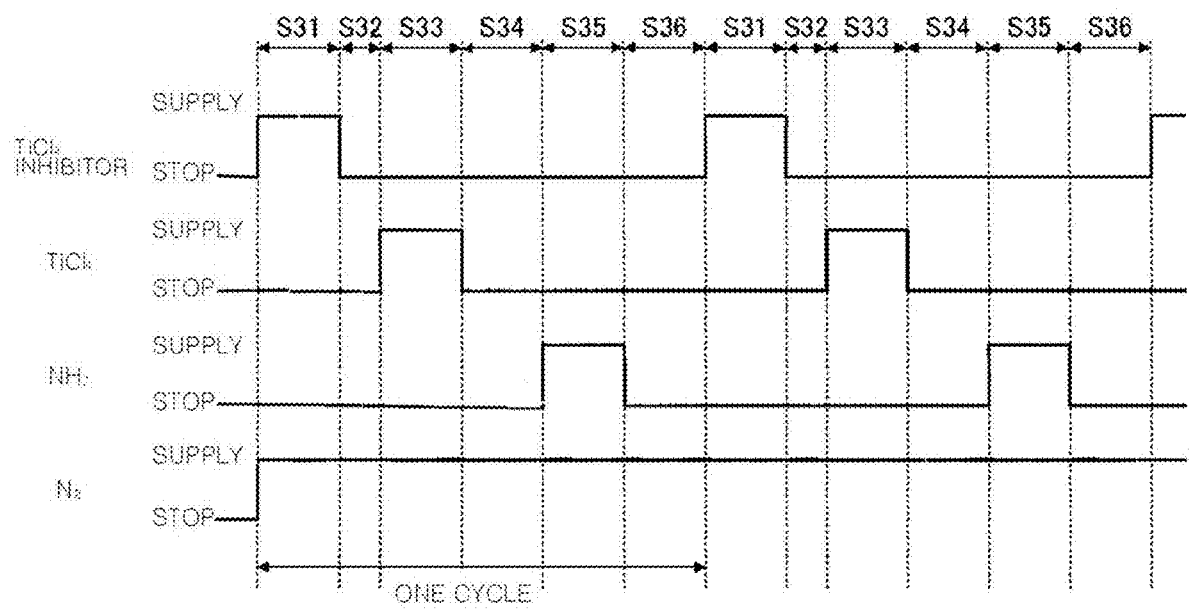
FIG. 3 is a diagram illustrating another example of a gas supply sequence of a method of forming a TiN film according to an embodiment.

FIG. 3 is a diagram illustrating another example of a gas supply sequence of a method of forming a TiN film according to an embodiment. In the method of forming the TiN film illustrated in FIG. 3, a plurality of cycles each including processes S31 to S36 are performed. Process S31 is a process of supplying a $TiCl_4$ inhibitor that inhibits adsorption of $TiCl_4$. Process S32 is a process of adjusting an adsorption amount of the $TiCl_4$ inhibitor. Process S33 is a process of supplying the $TiCl_4$ to a substrate. Process S34 is a process of purging the $TiCl_4$. Process S35 is a process of supplying $NH_3$ to the substrate. Process S36 is a process of purging the $NH_3$.

Figure 4A:
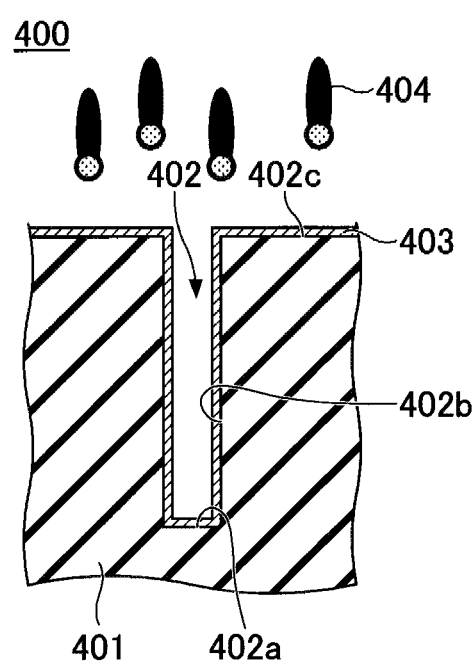
FIG. 4A is a process cross-sectional view illustrating another example of a method of forming a TiN film according to an embodiment.

FIGS. 4A to 4G are process cross-sectional views illustrating another example of a method of forming a TiN film according to an embodiment. FIGS. 4A to 4G illustrate a state in which a Ti—$NH_x$ layer is formed on an outermost surface of a concave portion after a plurality of cycles each including processes S31 to S36 are performed after the method of forming the TiN film starts. As illustrated in FIG. 4A, a target substrate 400 on which a TiN film is formed includes an insulating film 401 in which a concave portion 402 is formed. The insulating film 401 may be an $SiO_2$ film or an $Al_2O_3$ film.

Process S31 is performed after a process of supplying $NH_3$ and before a process of supplying $TiCl_4$. In process S31, as illustrated in FIG. 4A, a $TiCl_4$ inhibitor 404 that inhibits adsorption of $TiCl_4$ 406 is supplied to the substrate 400.

Adsorption energy of the $TiCl_4$ inhibitor 404 on the Ti—$NH_x$ layer 403 is preferably higher than adsorption energy of the $TiCl_4$ 406 on the Ti—$NH_x$ layer 403 from the viewpoint that the $TiCl_4$ inhibitor 404 is more easily adsorbed on a surface of the Ti—$NH_x$ layer 403 than the $TiCl_4$ 406. Examples of such $TiCl_4$ inhibitor may include boron trifluoride ($BF_3$), acetic acid ($CH_3CO_2H$), boron trichloride ($BCl_3$), hydrogen chloride (HCl), trimethylaluminum ($Al(CH_3)_3$), sulfuric acid ($H_2SO_4$), hydrogen bromide (HBr), and aluminum chloride ($AlCl_3$).

The supply of the $TiCl_4$ inhibitor 404 may be performed in a dilution gas environment. For example, the $TiCl_4$ inhibitor 404 may be supplied after an inside of the processing container is replaced with a dilution gas. Further, for example, the dilution gas may be supplied into the processing container together with the $TiCl_4$ inhibitor 404. In this case, the $TiCl_4$ inhibitor 404 may be supplied while supplying the dilution gas into the processing container, or the $TiCl_4$ inhibitor 404 and the dilution gas may be mixed and then the $TiCl_4$ inhibitor 404 (mixed gas) diluted with the dilution gas may be supplied into the processing container. Examples of the dilution gas may include an inert gas such as $N_2$ gas, a rare gas, or the like, $CO_2$ gas, and CO gas. The dilution gas preferably include at least one gas selected from the group consisting of He gas, Ne gas, Ar gas, Kr gas, Xe gas, N$_2$ gas, CO$_2$ gas, and CO gas.

Figure 4B:
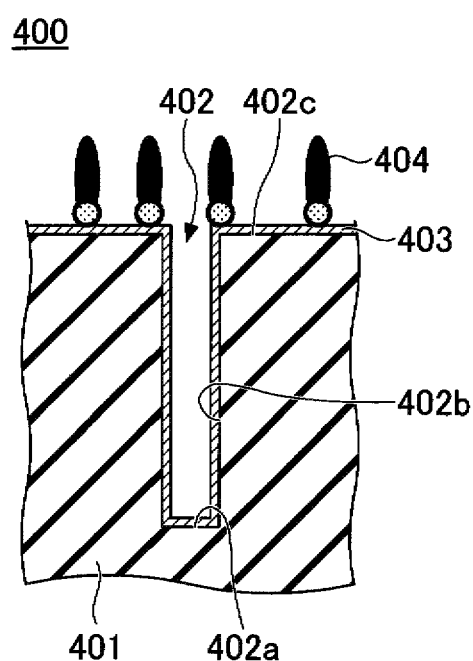
FIG. 4B is a process cross-sectional view illustrating another example of the method of forming the TiN film according to the embodiment.

In process S31, since the TiCl$_4$ inhibitor 404 is adsorbed on a surface of the Ti—NH$_x$ layer 403 formed in the concave portion 402, it is preferable that the TiCl$_4$ inhibitor 404 is easily adsorbed on the Ti—NH$_x$ layer 403. The TiCl$_4$ inhibitor having higher adsorption energy on the Ti—NH$_x$ layer 403 than that of the TiCl$_4$ is more easily adsorbed on the surface of the Ti—NH$_x$ layer 403 than the TiCl$_4$. For this reason, as illustrated in FIG. 4B, the TiCl$_4$ inhibitor is more easily adsorbed on an upper surface 402$c$ of the concave portion 402 than on a bottom surface 402$a$ and an inner wall 402$b$ thereof.

The likelihood of the adsorption of the TiCl$_4$ inhibitor 404 on the Ti—NH$_x$ layer 403 can be predicted, for example, by evaluating an adsorption energy (hereinafter referred to as a "second adsorption energy") of the TiCl$_4$ inhibitor 404 on the surface (surface site) of the Ti—NH$_x$ layer 403. Further, the "second adsorption energy" is given as a value obtained by subtracting energy before the adsorption from energy when the TiCl$_4$ inhibitor 404 is adsorbed on the surface site, and a negative value indicates that the adsorption state is stable. Further, the larger the second adsorption energy (negative value), the easier it is for the TiCl$_4$ inhibitor 404 to be adsorbed on the surface site, and the stronger an adsorption force is. The second adsorption energy is obtained by, for example, a density functional theory (PBE/DNP) using the DMol3 module of the software Materials Studio.

In process S32, a purge gas is supplied into the processing container. Thereby, an amount of the TiCl$_4$ inhibitor 404 adsorbed on the Ti—NH$_x$ layer 403 is adjusted. Specifically, by supplying the purge gas into the processing container, a part of the TiCl$_4$ inhibitor 404 adsorbed on the surface of the Ti—NH$_x$ layer 403 is removed together with the purge gas, and thus the amount of the TiCl$_4$ inhibitor 404 adsorbed on the Ti—NH$_x$ layer 403 is adjusted. In order to prevent the TiCl$_4$ inhibitor 404 adsorbed on the surface of the Ti—NH$_x$ layer 403 from being completely removed, a time of process S32 of adjusting the adsorption amount of the TiCl$_4$ inhibitor 404 is preferably shorter than a time of process S34 of purging the TiCl$_4$. Further, when it is not necessary to adjust the amount of the TiCl$_4$ inhibitor 404 adsorbed on the Ti—NH$_x$ layer 403, process S32 may be omitted. Examples of the purge gas may include an inert gas such as N$_2$ gas, a rare gas, or the like, CO$_2$ gas, and CO gas. Conditions for supplying the purge gas in process S32 are not particularly limited.

Further, process S32 may be performed by, for example, vacuum suctioning the inside of the processing container without supplying the purge gas into the processing container. Further, process S32 may be performed by supplying the purge gas into the processing container and then vacuum suctioning the inside of the processing container without supplying the purge gas into the processing container. Further, process S32 may be performed by a cycle purge in which the supply of the purge gas and the vacuum suction are repeated.

Figure 4C:
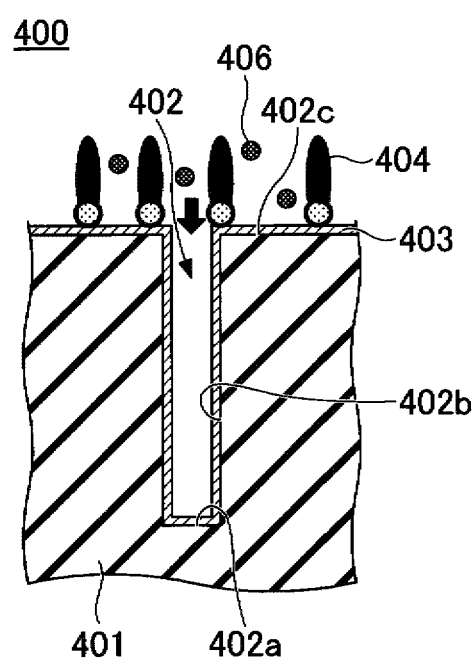
FIG. 4C is a process cross-sectional view illustrating another example of the method of forming the TiN film according to the embodiment.
Figure 4D:
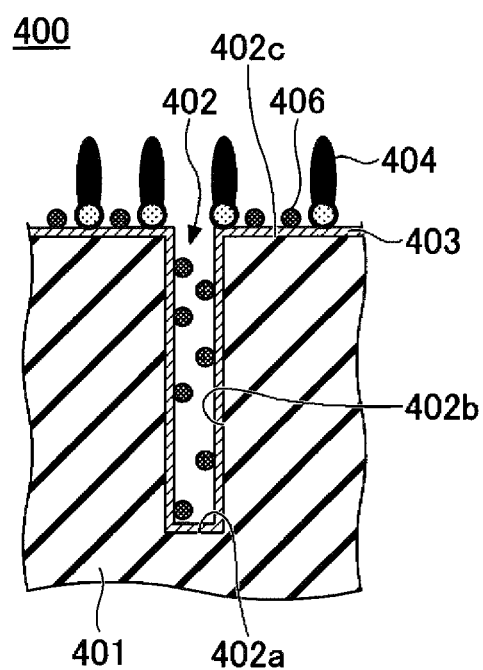
FIG. 4D is a process cross-sectional view illustrating another example of the method of forming the TiN film according to the embodiment.
Figure 4E:
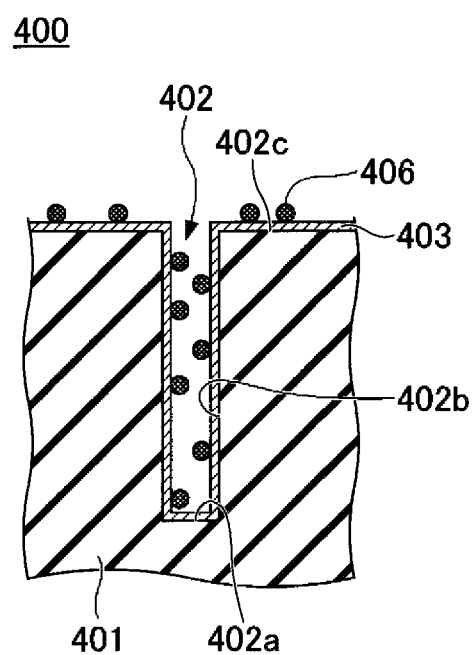
FIG. 4E is a process cross-sectional view illustrating another example of the method of forming the TiN film according to the embodiment.

In process S33, the TiCl$_4$ 406 is supplied to the concave portion 402, as illustrated in FIG. 4C. In this case, since a greater amount of the TiCl$_4$ inhibitor 404 is adsorbed on the upper surface 402$c$ of the concave portion 402 than on the bottom surface 402$a$ and the inner wall 402$b$ thereof, a part of the adsorption of the TiCl$_4$ 406 on the upper surface 402$c$ of the concave portion 402 is inhibited, as illustrated in FIG. 4D. For this reason, the TiCl$_4$ 406 is adsorbed on the bottom surface 402$a$, the inner wall 402$b$, and the upper surface 402$c$ of the concave portion 402 substantially uniformly.

In process S34, the purge gas is supplied into the processing container. Thereby, as illustrated in FIG. 4B, the TiCl$_4$ inhibitor 404 adsorbed on the surface of the Ti—NH$_x$ layer 403 and the TiCl$_4$ 406 remaining in the processing container are exhausted and removed from the inside of the processing container. Details of the purge gas and conditions for supplying the purge gas in process S34 may be the same as those in process S32 described above.

Figure 4F:
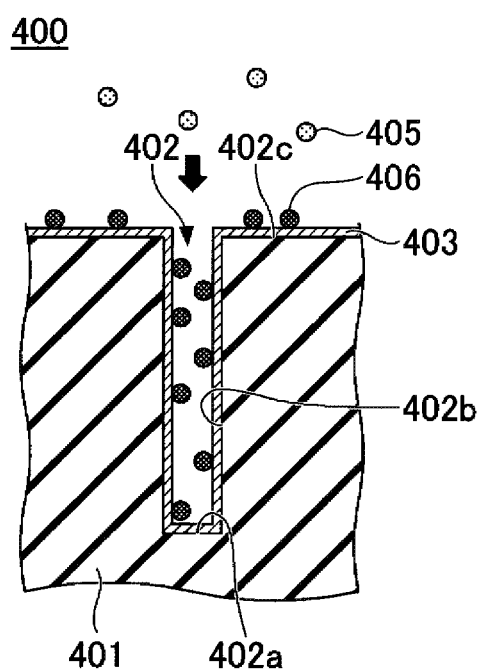
FIG. 4F is a process cross-sectional view illustrating another example of the method of forming the TiN film according to the embodiment.
Figure 4G:
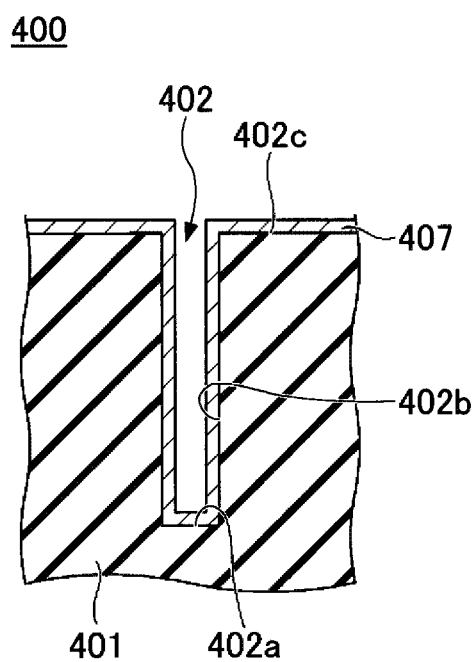
FIG. 4G is a process cross-sectional view illustrating another example of the method of forming the TiN film according to the embodiment.

In process S35, NH$_3$ 405 is supplied to the concave portion 402, as illustrated in FIG. 4F. Thereby, as illustrated in FIG. 4G, the TiCl$_4$ 406 adsorbed on the concave portion 402 and the NH$_3$ 405 supplied to the concave portion 402 react with each other, and thus a TiN layer 407 is formed.

In process S36, the purge gas is supplied into the processing container. Thereby, the NH$_3$ 405 remaining in the processing container is removed from the inside of the processing container. Specifically, by supplying the purge gas into the processing container, the NH$_3$ 405 in the processing container is exhausted together with the purge gas and removed from the inside of the processing container. Details of the purge gas and conditions for supplying the purge gas in process S36 may be the same as those in process S32 described above.

As described above, in the method of forming a TiN film according to the embodiment, before the TiCl$_4$ 406 is supplied to the concave portion 402, a greater amount of the TiCl$_4$ inhibitor 404 is adsorbed on an upper portion of the concave portion 402 than on a lower portion thereof. In the case in which a greater amount of the TiCl$_4$ inhibitor 404 is adsorbed on the upper portion of the concave portion 402 than on the lower portion thereof, when the TiCl$_4$ 406 is supplied to the concave portion 402, the adsorption of the TiCl$_4$ 406 onto the upper surface 402$c$ of the concave portion 402 is inhibited. For this reason, the TiCl$_4$ 406 is adsorbed on the bottom surface 402$a$, the inner wall 402$b$, and the upper surface 402$c$ of the concave portion 402 substantially uniformly. As a result, a thickness of the TiN layer 407 formed by reacting the TiCl$_4$ 406 and the NH$_3$ 405 becomes uniform. That is, a conformal TiN film can be formed in the concave portion 402.

Further, the method of forming a TiN film according to the embodiment can be suitably used in, for example, an application for forming a capacitor electrode. In particular, in a semiconductor device having a memory cell such as a DRAM or the like, due to complexity of a trench structure and an increase in aspect ratio of a trench, the step coverage of a TiN film has become an important issue. Therefore, according to the method of forming the TiN film according to the embodiment, ideal conformal film formation with high step coverage and a low loading effect is possible.

Further, although the case in which all of the plurality of cycles include process S31 of supplying the TiCl$_4$ inhibitor 404 is illustrated in the example of FIG. 3, the present disclosure is not limited thereto. For example, at least a part of the plurality of cycles may include process S31 of supplying the TiCl$_4$ inhibitor 404. In other words, in at least a part of the plurality of cycles, process S31 of supplying the TiCl$_4$ inhibitor 404 may be omitted. However, from the viewpoint of obtaining a more conformal TiN film, it is preferable to perform process S31 of supplying the TiCl$_4$ inhibitor 404 in all the cycles.

Further, although the case in which the N$_2$ gas is supplied in all processes S31 to S36 is illustrated in the example of FIG. 3, the present disclosure is not limited thereto. For example, the N$_2$ gas may be supplied at least in the purging processes S32, S34, and S36 and the N$_2$ gas may not be supplied in processes S31, S33, and S35.

(Example Using NH$_3$ Inhibitor and TiCl$_4$ Inhibitor)

Figure 5:
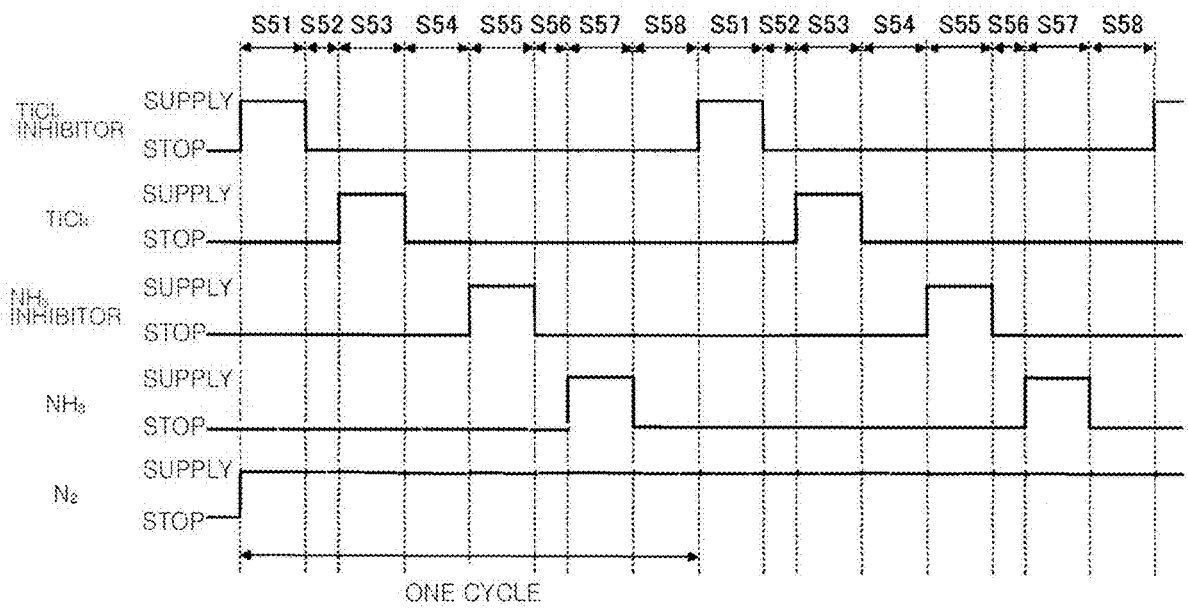
FIG. 5 is a diagram illustrating still another example of a gas supply sequence of a method of forming a TiN film according to an embodiment.

FIG. 5 is a diagram illustrating still another example of a gas supply sequence of a method of forming a TiN film according to an embodiment. In the method of forming the TiN film illustrated in FIG. 5, a plurality of cycles each including processes S51 to S58 are performed. Process S51 is a process of supplying a TiCl$_4$ inhibitor that inhibits adsorption of TiCl$_4$. Process S52 is a process of adjusting an adsorption amount of the TiCl$_4$ inhibitor. Process S53 is a process of supplying the TiCl$_4$ to a substrate. Process S54 is a process of purging the TiCl$_4$ and the TiCl$_4$ inhibitor. Process S55 is a process of supplying an NH$_3$ inhibitor that inhibits adsorption of NH$_3$. Process S56 is a process of adjusting an adsorption amount of the NH$_3$ inhibitor. Process S57 is a process of supplying the NH$_3$ to the substrate. Process S58 is a process of purging the NH$_3$ and the NH$_3$ inhibitor.

The method of forming the TiN film illustrated in FIG. 5 includes process S51 of supplying the TiCl$_4$ inhibitor and process S55 of supplying the NH$_3$ inhibitor. Process S51 of supplying the TiCl$_4$ inhibitor is performed after process S57 of supplying the NH$_3$ and before process S53 of supplying the TiCl$_4$. Process S55 of supplying the NH$_3$ inhibitor is performed after process S53 of supplying the TiCl$_4$ and before process S57 of supplying the NH$_3$.

Further, process S52 may be the same as process S32 described above, process S53 may be the same as process S33 described above, and process S54 may be the same as process S34 described above. Further, process S56 may be the same as process S12 described above, process S57 may be the same as process S13 described above, and process S58 may be the same as process S14 described above.

As described above, in the method of forming a TiN film according to the embodiment, before the NH$_3$ is supplied to the concave portion, a greater amount of the NH$_3$ inhibitor is adsorbed on an upper portion of the concave portion than on a lower portion thereof. In the case in which a greater amount of the NH$_3$ inhibitor is adsorbed on the upper portion of the concave portion than on the lower portion thereof, when the NH$_3$ is supplied to the concave portion, the adsorption of the NH$_3$ onto the upper surface of the concave portion is inhibited. For this reason, the NH$_3$ is adsorbed on the bottom surface, the inner wall, and the upper surface of the concave portion substantially uniformly. As a result, a thickness of the TiN layer formed by reacting the NH$_3$ and the TiCl$_4$ becomes uniform. That is, a conformal TiN film can be formed in the concave portion.

Further, in the method of forming a TiN film according to the embodiment, before the TiCl$_4$ is supplied to the concave portion, a greater amount of the TiCl$_4$ inhibitor is adsorbed on an upper portion of the concave portion than on a lower portion thereof. In the case in which a greater amount of the TiCl$_4$ inhibitor is adsorbed on the upper portion of the concave portion than on the lower portion thereof, when the TiCl$_4$ is supplied to the concave portion, the adsorption of the TiCl$_4$ onto the upper surface of the concave portion is inhibited. For this reason, the TiCl$_4$ is adsorbed on the bottom surface, the inner wall, and the upper surface of the concave portion substantially uniformly. As a result, a thickness of the TiN layer formed by reacting the NH$_3$ and the TiCl$_4$ becomes uniform. That is, a conformal TiN film can be formed in the concave portion.

Further, the method of forming a TiN film according to the embodiment can be suitably used in, for example, an application for forming a capacitor electrode. In particular, in a semiconductor device having a memory cell such as a DRAM or the like, due to complexity of the trench structure and an increase in aspect ratio of a trench, the step coverage of the TiN film has become an important issue. Therefore, according to the method of forming the TiN film according to the embodiment, ideal conformal film formation with high step coverage and a low loading effect is possible.

Further, although the case in which all of the plurality of cycles include process S51 of supplying the TiCl$_4$ inhibitor and process S55 of supplying the NH$_3$ inhibitor is illustrated in the example of FIG. 5, the present disclosure is not limited thereto. For example, at least a part of the plurality of cycles may include process S51 of supplying the TiCl$_4$ inhibitor. Further, at least a part of the plurality of cycles may include process S55 of supplying the NH$_3$ inhibitor. In other words, in at least a part of the plurality of cycles, process S51 of supplying the TiCl$_4$ inhibitor may be omitted. Further, in at least a part of the plurality of cycles, process S55 of supplying the NH$_3$ inhibitor may be omitted. However, from the viewpoint of obtaining a more conformal TiN film, it is preferable to perform process S51 of supplying the TiCl$_4$ inhibitor and process S55 of supplying the NH$_3$ inhibitor in all the cycles.

Further, although the case in which the N$_2$ gas is supplied in all processes S51 to S58 is illustrated in the example of FIG. 5, the present disclosure is not limited thereto. For example, the N$_2$ gas may be supplied at least in the purging processes S52, S54, S56, and S58 and the N$_2$ gas may not be supplied in processes S51, S53, S55, and S57.

[Film-Forming Device]

Figure 6:
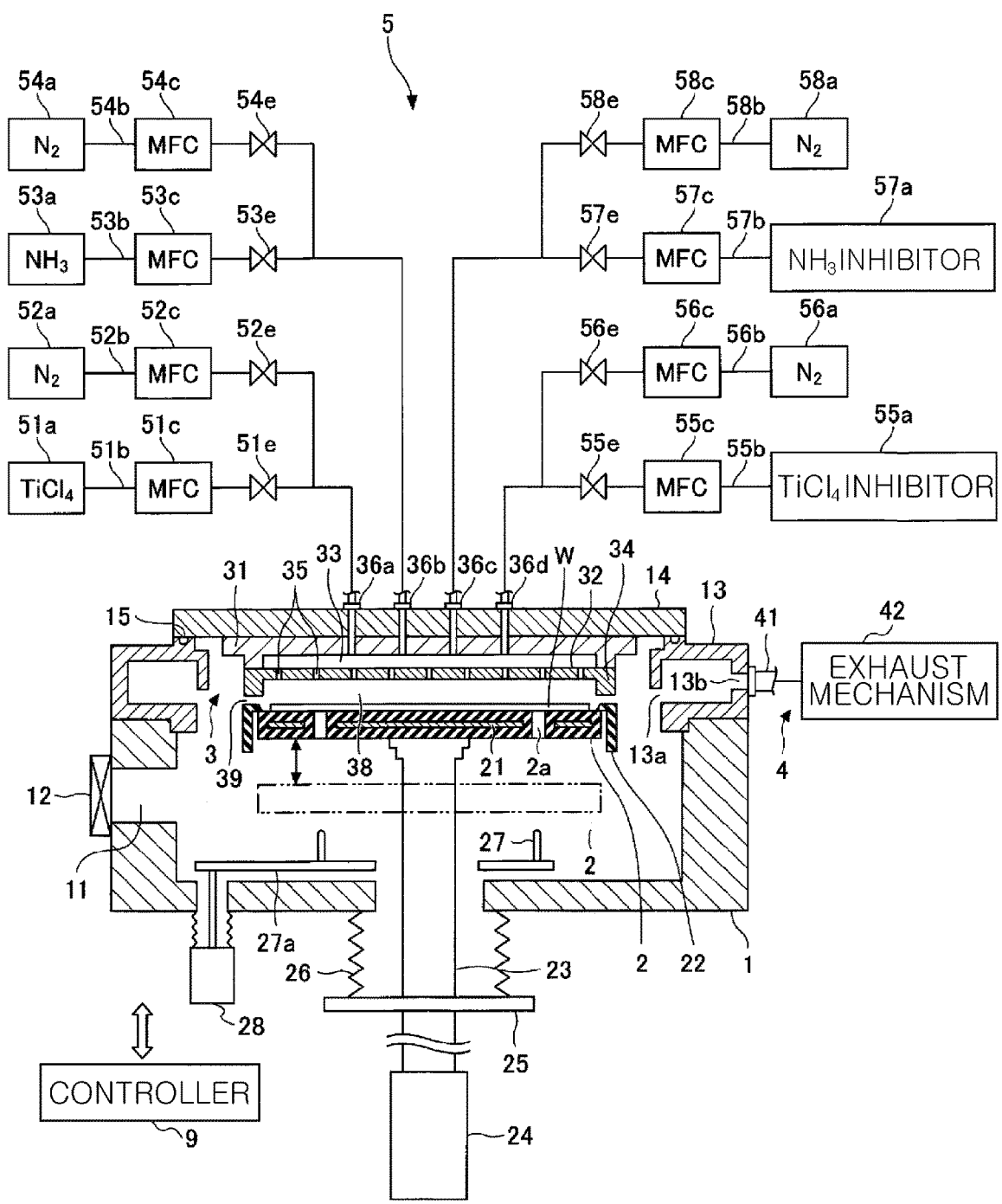
FIG. 6 is a diagram illustrating an example of a film-forming device.

A film-forming device used in the method of forming a TiN film according to an embodiment will be described using a single-wafer device as an example. FIG. 6 is a diagram illustrating an example of a film-forming device used in a method of forming a TiN film according to an embodiment.

As illustrated in FIG. 6, a film-forming device 100 includes a processing container 1, a stage 2, a showerhead 3, an exhaust unit 4, a gas supply mechanism 5, and a controller 9.

The processing container 1 is made of metal such as aluminum or the like and has a substantially cylindrical shape. The processing container 1 accommodates a wafer W. A loading/unloading port 11 for loading or unloading the wafer W is formed in a sidewall of the processing container 1, and the loading/unloading port 11 is opened or closed by a gate valve 12. An annular exhaust duct 13 having a rectangular cross section is provided on a main body of the processing container 1. A slit 13a is formed along an inner circumferential surface of the exhaust duct 13. An exhaust port 13b is formed in an outer wall of the exhaust duct 13. A ceiling wall 14 is provided on an upper surface of the exhaust duct 13 to close an upper opening of the processing container 1. A space between the exhaust duct 13 and the ceiling wall 14 is airtightly sealed with a seal ring 15.

The stage 2 supports the wafer W horizontally in the processing container 1. The stage 2 is formed in a disc shape having a size corresponding to the wafer W and is supported by a support member 23. The stage 2 is made of a ceramic material such as AlN or a metal material such as aluminum, a nickel alloy, or the like, and a heater 21 for heating the wafer W is embedded therein. The heater 21 is supplied with electricity from a heater power supply (not illustrated) to generate heat. Then, the wafer W is controlled to a predetermined temperature by controlling an output of the heater 21 using a temperature signal of a thermocouple (not illustrated) provided in the vicinity of an upper surface of the stage 2. A cover member 22, which is formed of ceramic such as alumina, is provided on the stage 2 to cover an outer circumferential region of the upper surface of the stage 2 and side surfaces thereof.

The support member 23 for supporting the stage 2 is provided on a bottom surface of the stage 2. The support member 23 extends from the center of the bottom surface of the stage 2 to a lower side of the processing container 1 to pass through a hole formed in a bottom wall of the processing container 1, and a lower end of the support member 23 is connected to a lifting mechanism 24. The lifting mechanism 24 causes the stage 2 to move up and down via the support member 23 between a processing position illustrated in FIG. 6 and a transfer position where the wafer W can be transferred which is indicated by an alternate long and two short dashes line below the processing position. A flange 25 is attached to the support member 23 below the processing container 1, and a bellows 26 that separates an atmosphere inside the processing container 1 from outside air and expands and contracts as the stage 2 moves up and down is provided between a bottom surface of the processing container 1 and the flange 25.

In the vicinity of the bottom surface of the processing container 1, three wafer support pins 27 (only two are illustrated) are provided to protrude upward from a lifting plate 27a. The wafer support pins 27 are raised and lowered via the lifting plate 27a by a lifting mechanism 28 provided below the processing container 1. The wafer support pins 27 are inserted into a through hole 2a provided in the stage 2 placed at the transfer position, and can be raised or lowered with respect to the upper surface of the stage 2. The wafer W is transferred between a transfer mechanism (not illustrated) and the stage 2 by raising and lowering the wafer support pins 27.

The showerhead 3 supplies a processing gas into the processing container 1 in the form of a shower. The showerhead 3 is made of a metal, is provided to face the stage 2, and has substantially the same diameter as the stage 2. The showerhead 3 has a main body portion 31 fixed to the ceiling wall 14 of the processing container 1, and a shower plate 32 connected under the main body portion 31 to be connected. A gas diffusion space 33 is formed between the main body portion 31 and the shower plate 32, and gas introduction holes 36a to 36d are provided in the gas diffusion space 33 to pass through the ceiling wall 14 of the processing container 1 and the center of the main body portion 31. An annular projection 34 protruding downward is formed on the periphery of the shower plate 32. Gas discharge holes are formed in an inner flat surface of the annular projection 34. In the state in which the stage 2 is present at the processing position, a processing space 38 is formed between the stage 2 and the shower plate 32, and an annular gap 39 is formed by the proximity of an upper surface of the cover member 22 and the annular projection 34.

The exhaust unit 4 exhausts an inside of the processing container 1. The exhaust unit 4 includes an exhaust pipe 41 connected to the exhaust port 13b, and an exhaust mechanism 42 which has a vacuum pump, a pressure control valve, or the like connected to the exhaust pipe 41. At the time of processing, the gas in the processing container 1 reaches the exhaust duct 13 through the slit 13a and is exhausted from the exhaust duct 13 through the exhaust pipe 41 by the exhaust mechanism 42.

The gas supply mechanism 5 supplies the processing gas into the processing container 1. The gas supply mechanism 5 includes a $TiCl_4$ gas supply source 51a, an $N_2$ gas supply source 52a, an $NH_3$ gas supply source 53a, an $N_2$ gas supply source 54a, a $TiCl_4$ inhibitor supply source 55a, an $N_2$ gas supply source 56a, an $NH_3$ inhibitor supply source 57a, and an $N_2$ gas supply source 58a.

The $TiCl_4$ gas supply source 51a supplies $TiCl_4$ gas into the processing container 1 via a gas supply line 51b. A flow rate controller 51c and a valve 51e are connected to the gas supply line 51b from an upstream side. A downstream side of the valve 51e of the gas supply line 51b is connected to the gas introduction hole 36a. The supply and stop of the $TiCl_4$ gas from the $TiCl_4$ gas supply source 51a into the processing container 1 are performed by opening and closing the valve 51e.

The $N_2$ gas supply source 52a supplies $N_2$ gas, which is a carrier gas of the $TiCl_4$ gas, into the processing container 1 via a gas supply line 52b. A flow rate controller 52c and a valve 52e are connected to the gas supply line 52b from an upstream side. A downstream side of the valve 52e of the gas supply line 52b is connected to the gas supply line 51b. The $N_2$ gas supplied from the $N_2$ gas supply source 52a is continuously supplied into the processing container 1 during, for example, a film forming process. The supply and stop of the $N_2$ gas from the $N_2$ gas supply source 52a into the processing container 1 are performed by opening and closing the valve 52e.

The $NH_3$ gas supply source 53a supplies $NH_3$ gas into the processing container 1 via a gas supply line 53b. A flow rate controller 53c and a valve 53e are connected to the gas supply line 53b from an upstream side. A downstream side of the valve 53e of the gas supply line 53b is connected to the gas introduction hole 36b. The supply and stop of the $NH_3$ gas from the $NH_3$ gas supply source 53a into the processing container 1 are performed by opening and closing the valve 53e.

The $N_2$ gas supply source 54a supplies $N_2$ gas, which is a carrier gas of the $NH_3$ gas, into the processing container 1 via a gas supply line 54b. A flow rate controller 54c and a valve 54e are connected to the gas supply line 54b from an upstream side. A downstream side of the valve 54e of the gas supply line 54b is connected to the gas supply line 53b. The $N_2$ gas supplied from the $N_2$ gas supply source 54a is continuously supplied into the processing container 1 during, for example, a film forming process. The supply and stop of the $N_2$ gas from the $N_2$ gas supply source 54a into the processing container 1 are performed by opening and closing the valve 54e.

The $TiCl_4$ inhibitor supply source 55a supplies a $TiCl_4$ inhibitor into the processing container 1 via a gas supply line 55b. A flow rate controller 55c and a valve 55e are connected to the gas supply line 55b from an upstream side. A downstream side of the valve 55e of the gas supply line 55b is connected to the gas introduction hole 36d. The supply and stop of the $TiCl_4$ inhibitor from the $TiCl_4$ inhibitor supply source 55a into the processing container 1 are performed by opening and closing the valve 55e.

The $N_2$ gas supply source 56a supplies $N_2$ gas, which is a carrier gas of the $TiCl_4$ inhibitor, into the processing container 1 via a gas supply line 56b. A flow rate controller 56c and a valve 56e are connected to the gas supply line 56b from an upstream side. A downstream side of the valve 56e of the gas supply line 56b is connected to the gas supply line 55b. The $N_2$ gas supplied from the $N_2$ gas supply source 56a is continuously supplied into the processing container 1 during, for example, a film forming process. The supply and stop of the $N_2$ gas from the $N_2$ gas supply source 56a into the processing container 1 are performed by opening and closing the valve 56e.

The $NH_3$ inhibitor supply source 57a supplies an $NH_3$ inhibitor into the processing container 1 via a gas supply line 57b. A flow rate controller 57c and a valve 57e are connected to the gas supply line 57b from an upstream side. A downstream side of the valve 57e of the gas supply line 57b is connected to the gas introduction hole 36c. The supply and stop of the NH$_3$ inhibitor from the NH$_3$ inhibitor supply source 57a into the processing container 1 are performed by opening and closing the valve 57e.

The N$_2$ gas supply source 58a supplies N$_2$ gas, which is a carrier gas of the NH$_3$ inhibitor, into the processing container 1 via a gas supply line 58b. A flow rate controller 58c and a valve 58e are connected to the gas supply line 58b from an upstream side. A downstream side of the valve 58e of the gas supply line 58b is connected to the gas supply line 57b. The N$_2$ gas supplied from the N$_2$ gas supply source 58a is continuously supplied into the processing container 1 during, for example, a film forming process. The supply and stop of the N$_2$ gas from the N$_2$ gas supply source 58a into the processing container 1 are performed by opening and closing the valve 58e.

The controller 9 is, for example, a computer, and includes a central processing unit (CPU), a random access memory (RAM), a read only memory (ROM), an auxiliary storage device, and the like. The CPU operates based on a program, which is stored in a ROM or an auxiliary storage device, and controls the operation of the film-forming device 100. The controller 9 may be provided inside the film-forming device 100 or may be provided outside the film-forming device 100. When the controller 9 is provided outside the film-forming device 100, the controller 9 can control the film-forming device 100 using a wired or wireless communication means.

[Operation of Film-Forming Device]

An example of the operation of the film-forming device 100 will be described. Further, at the time of starting, the inside of the processing container 1 has a vacuum atmosphere due to the exhaust unit 4. Further, the stage 2 has moved to the transfer position.

The controller 9 opens the gate valve 12. Here, the wafer W is placed on the wafer support pins 27 by an external transfer mechanism (not illustrated). When the transfer mechanism comes out of the loading/unloading port 11, the controller 9 closes the gate valve 12.

The controller 9 controls the lifting mechanism 24 to move the stage 2 to the processing position. In this case, by raising the stage 2, the wafer W placed on the wafer support pins 27 is placed on a mounting surface of the stage 2.

At the processing position, the controller 9 operates the heater 21 and controls the gas supply mechanism 5 to supply a processing gas such as TiCl$_4$ gas, NH$_3$ gas, a TiCl$_4$ inhibitor, an NH$_3$ inhibitor, or the like or a carrier gas such as N$_2$ gas or the like, into the processing container 1. Thereby, a TiN film is formed on the wafer W. The gas after the processing is exhausted by the exhaust mechanism 42 via the exhaust pipe 41.

When the predetermined processing is completed, the controller 9 controls the lifting mechanism 24 to move the stage 2 to the transfer position. At this time, head portions of the wafer support pins 27 protrude from the mounting surface of the stage 2, and the wafer W is lifted from the mounting surface of the stage 2.

The controller 9 opens the gate valve 12. Here, the wafer W placed on the wafer support pins 27 is unloaded by the external transfer mechanism. When the transfer mechanism comes out of the loading/unloading port 11, the controller 9 closes the gate valve 12.

As described above, according to the film-forming device 100 illustrated in FIG. 6, a TiN film can be formed on the wafer W.

[Simulation Result]

Using the DMol3 module of the software Materials Studio, adsorption energy of an NH$_3$ inhibitor on a surface of a TiCl$_x$ layer and adsorption energy of a TiCl$_4$ inhibitor on a surface of a Ti—NH$_x$ layer were calculated by a density functional theory (PBE/DNP).

Figure 7:
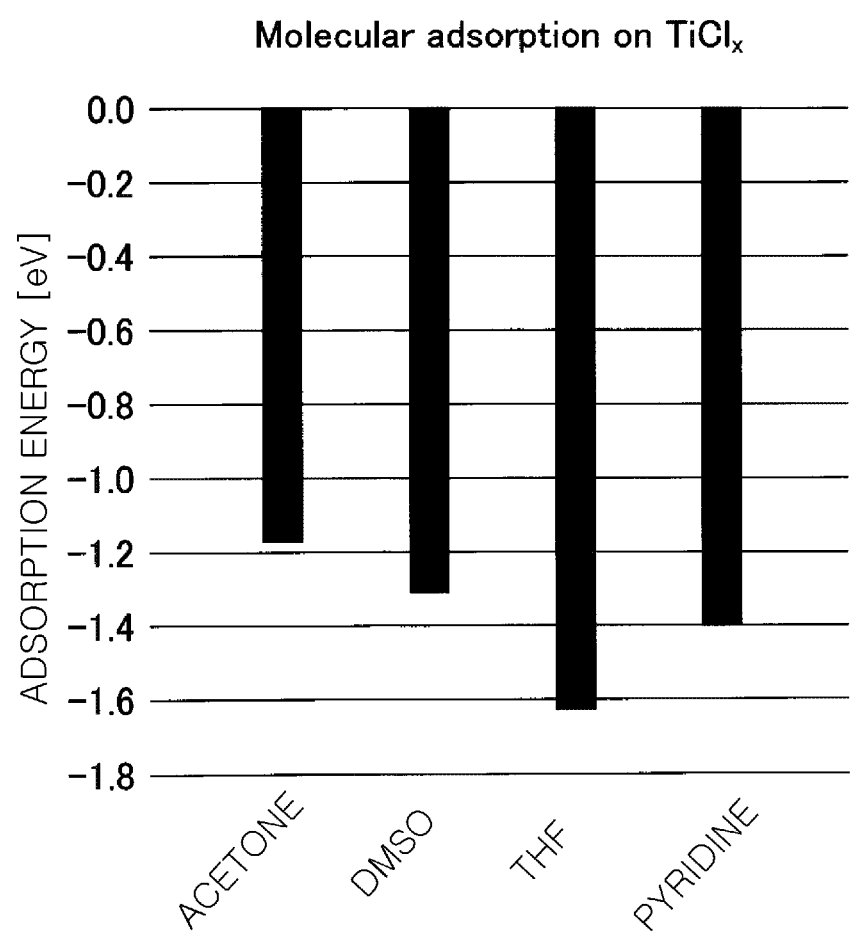
FIG. 7 is a diagram illustrating an example of simulation results of adsorption energy of an $NH_3$ inhibitor.

FIG. 7 is a diagram illustrating an example of simulation results of adsorption energy of an NH$_3$ inhibitor. FIG. 7 illustrates calculation results of adsorption energy of acetone, DMSO, THF, and pyridine on a surface of a TiCl$_x$ layer in order from the left side.

As illustrated in FIG. 7, the adsorption energies of acetone, DMSO, THF, and pyridine were higher than −1.1 eV.

Figure 8:
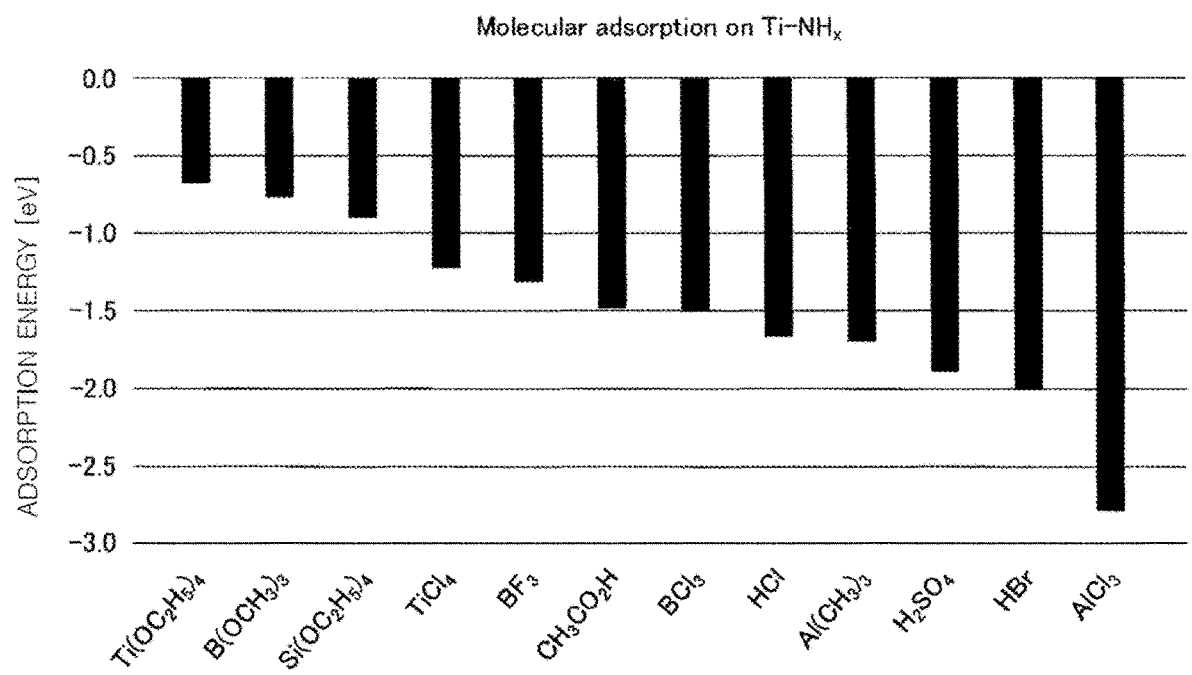
FIG. 8 is a diagram illustrating an example of simulation results of adsorption energy of a $TiCl_4$ inhibitor.

FIG. 8 is a diagram illustrating an example of simulation results of adsorption energy of a TiCl$_4$ inhibitor. FIG. 8 illustrates calculation results of adsorption energy of Ti(OC$_2$H$_5$)$_4$, B(OCH$_3$)$_3$, Si(OC$_2$H$_5$)$_4$, TiCl$_4$, boron trifluoride (BF$_3$), acetic acid (CH$_3$CO$_2$H), boron trichloride (BCl$_3$), hydrogen chloride (HCl), trimethylaluminum (Al(CH$_3$)$_3$), sulfuric acid (H$_2$SO$_4$), hydrogen bromide (HBr), and aluminum chloride (AlCl$_3$) on a surface of a Ti—NH$_x$ layer in order from the left side.

As illustrated in FIG. 8, the adsorption energies of Ti(OC$_2$H$_5$)$_4$, B(OCH$_3$)$_3$, and Si(OC$_2$H$_5$)$_4$ are in a range of −0.5 eV to −1.0 eV and were lower than the adsorption energy of the TiCl$_4$. On the other hand, the adsorption energies of BF$_3$, CH$_3$CO$_2$H, BCl$_3$, HCl, Al(CH$_3$)$_3$, H$_2$SO$_4$, HBr, and AlCl$_3$ are in a range of −1.0 eV to −3.0 eV and were higher than the adsorption energy of the TiCl$_4$.

When a TiN film is formed using an ALD process, it is preferable to use a TiCl$_4$ inhibitor containing BF$_3$, CH$_3$CO$_2$H, BCl$_3$, HCl, Al(CH$_3$)$_3$, H$_2$SO$_4$, HBr, and AlCl$_3$ having higher adsorption energy than TiCl$_4$. Thereby, an inhibitor can be easily adsorbed on a surface of a Ti—NH$_x$ layer.

The embodiment disclosed here should be considered exemplary and not restrictive in any respect. The above embodiment may be omitted, replaced, or modified in various forms without departing from the scope of the appended claims and their gist.

Although the case in which a film-forming device is a single-wafer device that processes wafers one by one has been described in the above embodiment, the present disclosure is not limited thereto. For example, the film-forming device may be a batch type device that processes a plurality of wafers at once.

This international application claims priority based on Japanese Patent Application No. 2019-174644 filed on Sep. 25, 2019, and the entire contents of this application shall be incorporated into this international application.

DESCRIPTION OF REFERENCE NUMERALS

1: processing container
5: gas supply mechanism
9: controller
100: film-forming device

The invention claimed is:

1. A method for manufacturing a semiconductor device including a TiN film, the method comprising:
   supplying TiCl$_4$ gas to a substrate;
   purging the TiCl$_4$ gas;
   supplying NH$_3$ gas to the substrate;
   purging the NH$_3$ gas; and
   supplying an inhibitor that inhibits adsorption of TiCl$_4$ or NH$_3$ to the substrate, wherein a plurality of cycles each including the supplying the TiCl$_4$ gas, the purging the TiCl$_4$ gas, the supplying the NH$_3$ gas, and the purging the NH$_3$ gas are performed, at least a part of the plurality of cycles includes the supplying the inhibitor, and after the supplying the inhibitor is performed, the supplying the TiCl$_4$ gas or the supplying the NH$_3$ gas is performed without purging the inhibitor, or, after purging the inhibitor for a shorter time than the purging the TiCl$_4$ gas or the purging the NH$_3$ gas, the supplying the TiCl$_4$ gas or the supplying the NH$_3$ gas is performed.

2. The method of claim 1, wherein the supplying the inhibitor includes supplying an NH$_3$ inhibitor that inhibits adsorption of the NH$_3$ between the supplying the TiCl$_4$ gas and the supplying the NH$_3$ gas.

3. The method of claim 2, wherein the NH$_3$ inhibitor includes an organic compound having at least one of a C=O bond, an S=O bond, a CN ring, and a CO ring.

4. The method of claim 3, wherein the NH$_3$ inhibitor includes acetone, dimethyl sulfoxide (DMSO), THF, pyridine, or a derivative thereof.

5. The method of claim 1, wherein the supplying the inhibitor includes supplying a TiCl$_4$ inhibitor that inhibits adsorption of the TiCl$_4$ between the supplying the NH$_3$ gas and the supplying the TiCl$_4$ gas.

6. The method of claim 5, wherein adsorption energy of the TiCl$_4$ inhibitor on a surface of a Ti—NH$_x$ layer is higher than adsorption energy of the TiCl$_4$ on the surface of the Ti—NH$_x$ layer.

7. The method of claim 6, wherein the TiCl$_4$ inhibitor includes BF$_3$, CH$_3$CO$_2$H, BCl$_3$, HCl, Al(CH$_3$)$_3$, H$_2$SO$_4$, HBr, or AlCl$_3$.

8. The method of claim 1, wherein a concave portion is formed in the substrate.

9. The method of claim 8, wherein, in the supplying the inhibitor, a greater amount of the inhibitor is adsorbed on an upper portion of the concave portion than on a lower portion thereof.

* * * * *